United States Patent
Tonomura

(10) Patent No.: US 8,248,838 B2
(45) Date of Patent: Aug. 21, 2012

(54) SEMICONDUCTOR DEVICE

(75) Inventor: Yasuko Tonomura, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 323 days.

(21) Appl. No.: 12/591,823

(22) Filed: Dec. 2, 2009

(65) Prior Publication Data

US 2010/0080041 A1  Apr. 1, 2010

(30) Foreign Application Priority Data

Dec. 4, 2008 (JP) ................................. 2008-309591

(51) Int. Cl.
*G11C 11/00* (2006.01)
(52) U.S. Cl. ... 365/148; 365/158; 365/171; 365/189.07; 365/189.15; 365/201
(58) Field of Classification Search .................. 365/148, 365/158, 163, 171, 189.07, 189.15, 201
See application file for complete search history.

(56) References Cited

U.S. PATENT DOCUMENTS

| 6,359,829 B1 * | 3/2002 | Van Den Berg | 365/232 |
| 6,791,890 B2 * | 9/2004 | Ooishi | 365/189.15 |
| 6,885,579 B2 * | 4/2005 | Sakimura et al. | 365/158 |
| 2006/0164898 A1 * | 7/2006 | Pio | 365/210 |

FOREIGN PATENT DOCUMENTS

JP  2008-142098  6/2008

* cited by examiner

*Primary Examiner* — Pho M Luu
*Assistant Examiner* — Thao Bui
(74) *Attorney, Agent, or Firm* — McGinn IP Law Group, PLLC

(57) ABSTRACT

A semiconductor device includes a comparison unit for comparing a resistance value of a memory element selectively connected to an input terminal with a resistance value of a reference resistance, and a resistance reference unit capable of selecting one of a plurality of resistance values and capable of being selectively connected to the input terminal.

19 Claims, 5 Drawing Sheets

SEMICONDUCTOR DEVICE

This application is based on and claims priority from Japanese Patent Application No. 2008-309591 filed on Dec. 4, 2008. The disclosure thereof is incorporated herein by reference in its entirety.

BACKGROUND OF THE INVENTION

1. Field of the Invention

This invention relates to a semiconductor device and a calibration method therefor, and particularly to a semiconductor device in which an element, like a phase-change memory element, the resistance value of which varies in accordance with stored data is used as a memory element, and a calibration method for such a semiconductor device.

2. Description of the Related Art

This type of semiconductor devices is typically designed to read out data from a selected memory element by comparing a cell voltage with a reference voltage. Here, the cell voltage is a voltage corresponding to a level of current flowing through the selected memory element. The reference voltage is a voltage corresponding to a level of current flowing through a reference resistance having a resistance value which is set to a substantially intermediate value between a resistance value when the memory element stores data "1" and a resistance value when the memory element stores data "0". It is detected whether the data stored in the memory element is "1" or "0" by comparing the cell voltage with the reference voltage. Ideally, the resistance value of each memory element exhibits a resistance value corresponding to the stored data. Actually, however, there exist a great number of memory elements which necessarily do not exhibit the same characteristics. It is therefore required for the resistance value of the reference resistance to be set to such a value that absorbs variation in the resistance value according to the stored data in the memory elements.

In order to solve this problem, the inventor of this invention has previously proposed a semiconductor device configured such that the resistance value of the reference resistance can be set by selecting from a plurality of values, and has filed patent applications for the invention (Japanese Patent Application No. 2008-142098 and U.S. Ser. No. 12/453,988).

SUMMARY

The basic concept of the invention of the above-mentioned patent applications resides in the idea that a reference voltage generating circuit system is matched with a cell voltage generating circuit system, on the assumption that the reference voltage generating circuit system is fabricated precisely according to the design. However, the inventor of this invention has recognized that the invention of the above-mentioned patent applications has a problem that the reference circuit system itself may possibly not perform circuit operation as desired, for example due to the settings of circuit constants thereof.

In one embodiment, there is provided a semiconductor device that includes a comparison unit which compares a resistance value of a memory element selectively connected to an input terminal with a resistance value of a reference resistance and a resistance reference unit which has a plurality of selectable resistance values and which is capable of being selectively connected to the input terminal.

In another embodiment, there is provided a semiconductor device that includes a readout circuit which compares a cell voltage according to current flowing through a selected memory cell with a reference voltage according to current flowing through a reference resistance and a dummy cell circuit which is capable of setting a plurality of levels of current flowing through the same. In the device, a voltage according to current flowing through the dummy cell circuit instead of the cell voltage can be compared with the reference voltage.

In still another embodiment, there is provided a semiconductor device that includes a plurality of memory cells, a reference resistive element, a dummy cell circuit, a sense circuit which produces at an output node thereof in a first mode a first voltage related to a selected one of the memory cells and in a second mode a second voltage related to the dummy cell circuit, a reference circuit which produces at an output node thereof a third voltage related to the reference resistive element, and a comparator which compares voltages at the output nodes of the sense circuit and the reference circuit with each other.

According to this invention, in which a resistance reference unit having a plurality of selectable resistance values is provided at an input terminal of a comparison unit such that the resistance reference unit can be selectively connected, a resistance value of the resistance reference unit, instead of a resistance value of a memory element, can be compared with the resistance value of the reference resistance. This enables calibration of a readout circuit.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 1:
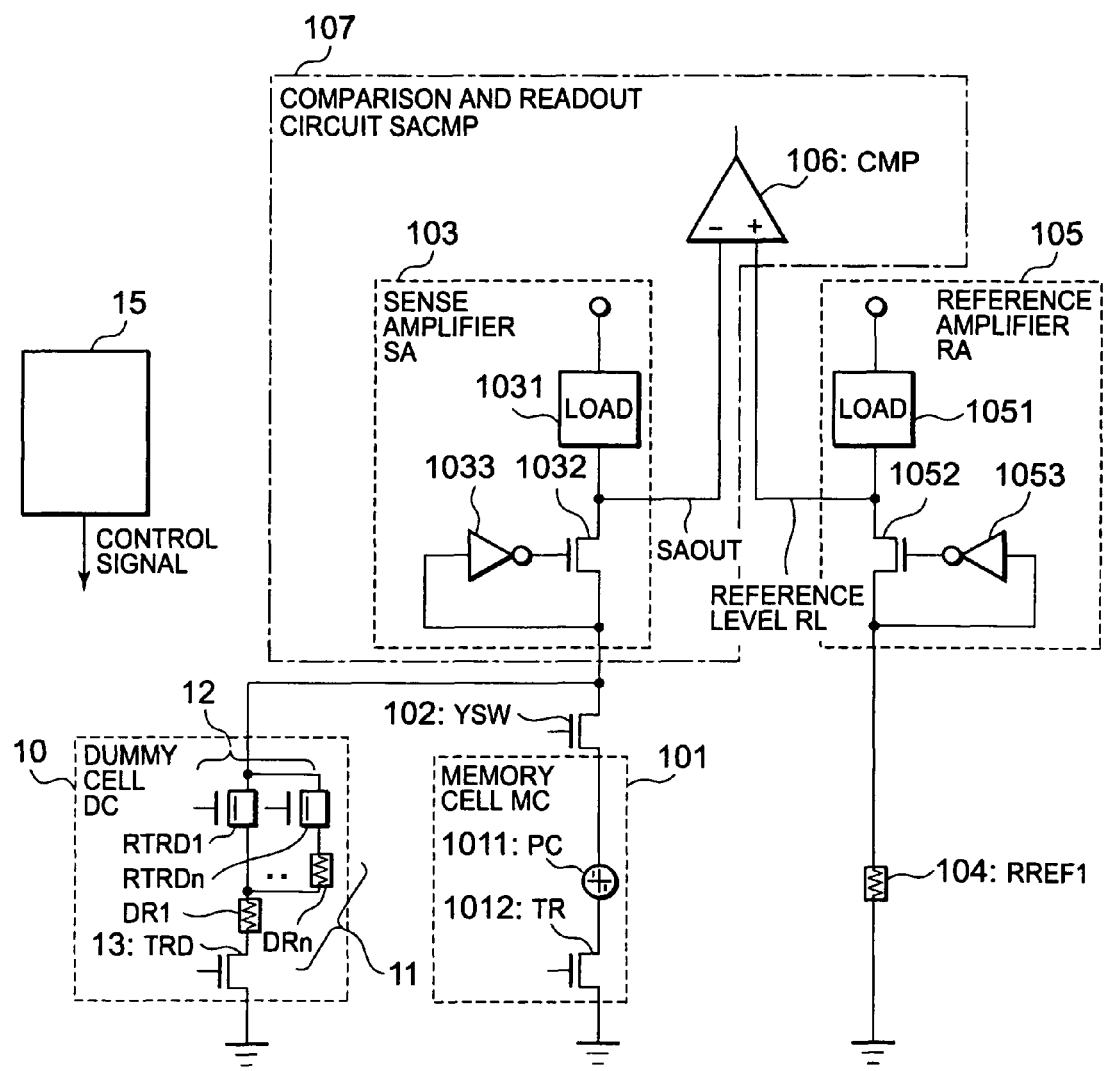
FIG. 1 is a circuit diagram showing a schematic configuration of a readout system circuit in a semiconductor device according to a first embodiment of this invention.

FIG. 1 shows a circuit configuration example of a readout system circuit in a semiconductor device according to a first embodiment of this invention. The shown readout system circuit has a memory cell (MC) 101, a sense amplifier (SA) 103 connected to the memory cell 101 by means of a Y switch (YSW) 102, a reference resistance (or cell RREF1) 104 as a reference resistive element, a reference amplifier (RA) 105 connected to the reference resistance 104, and a comparator (CMP) 106 for comparing an output level of the sense amplifier 103 with an output level of the reference amplifier 105.

This readout system circuit additionally has a dummy cell (DC) 10 serving as a resistance reference unit.

The memory cell 101 has a resistance change cell (PC) 1011 including a phase-change film which is made of a phase-change material and varies its resistance value in response to phase change of the material, and a selection transistor (TR) 1012. The resistance change cell 1011 may be referred to as a phase change memory cell. The resistance change cell 1011 is a memory element which stores 1-bit data as a resistance value by changing the phase state of the phase-change film according to the data written therein.

The sense amplifier 103 and the reference amplifier 105 include loads 1031 and 1051, transistors 1032 and 1052, and inverters 1033 and 1053, respectively. When both the Y switch 102 and the selection transistor 1012 are in an ON-state, the sense amplifier 103 produces a first voltage related to the memory cell 101 at an output node thereof. In other words, the sense amplifier 103 converts the resistance value of the resistance change cell 1011 into a potential level and outputs the same as a detection level (SAOUT). As mentioned later, the sense amplifier 103 further produces a second voltage related to the dummy cell 10 at the output node thereof. Meanwhile, the reference amplifier 105 produces a third voltage related to the reference resistance 104 at an output node thereof. In other words, the reference amplifier 105 converts the resistance value of the reference resistance 104 into a potential level and outputs the same as a reference level (RL).

The sense amplifier 103 and the comparator 106 together form a comparison and readout circuit (SACMP) 107. The comparison and readout circuit 107 and the reference amplifier 105 together function as a comparison unit for comparing the resistance value of the resistance change cell 1011 with the resistance value of the reference resistance 104. The connecting point between the sense amplifier 103 and the Y switch 102 corresponds to the input terminal of the comparison unit. The dummy cell 10 is connected to this input terminal of the comparison unit.

The dummy cell 10 is configured to have a plurality of selectable resistance values so that the second voltage may be changed in accordance with a selected one of the resistance values. In the example shown in FIG. 1, the dummy cell 10 has a plurality (here, the number n) of resistance elements (dummy resistances DR1 to DRn) 11, resistance selecting transistors (RTRD1 to RTRDn) 12 connected to these resistance elements 11, respectively, and a selection transistor (TRD) 13.

The dummy resistances DR2 to DRn are set such that their resistance values differ from each other by a predetermined value. These dummy resistances DR2 to DRn are connected in series to the dummy resistance DR1. The resistance selecting transistors 12 each function as a resistance selecting switch which selects one of the plurality of selectable resistance values. That is, one or two of the resistance elements 11 are activated by the resistance selecting transistors 12 to represent one of the selectable resistance values. According to the configuration described above, the resistance value of the dummy cell 10 can be varied by a predetermined value each time by selectively turning ON the resistance selecting transistors 12 one at a time. The resistance values of the dummy resistances DR1 to DRn are set, for example, such that a plurality of resistance values differing from each other by a predetermined value can be generated with the center resistance value being set equal to the resistance value (design value) of the reference resistance 104.

The selection transistor 13 functions in a similar manner to the selection transistor 1012 in the memory cell 101. Specifically, when the selection transistor 13 is turned ON, the dummy cell 10 is thereby selectively connected to the sense amplifier 103 if any of the resistance selecting transistors 12 is in an ON-state.

The internal configuration of the dummy cell 10 is not limited to the one shown in FIG. 1, but may assume any configuration so far as the dummy cell has a plurality of selectable resistance values.

Description will now be made of operation of the readout system circuit shown in FIG. 1.

The writing of data ("0" or "1") into the memory cell 101 is performed by changing the phase state of the phase-change film of the resistance change cell (PC) 1011 according to the data to be written. The resistance value of the resistance change cell 1011 varies in accordance with the phase state of the phase-change film. Since the writing of data into the memory cell 101 is not directly related to this invention, detailed description thereof will be omitted.

The following description will be made on the assumption that the semiconductor device operates on the basis of control signals (including mode signals) supplied from a control device (or inspection device) 15 connected to an external terminal (not shown) of the semiconductor device. For example, the ON/OFF control of the selection transistors 13 and 1012, the resistance selecting transistor 12, and the Y switch 102 is also performed according to a control signal from the control device 15. Further, the determination of whether the readout data is "1" or "0" based on an output from the comparator 106 is also performed by the control device 15 or other device connected to the external connecting terminal not shown.

Description will first be made of the case in which data is read out from the memory cell 101. In this case, a positive voltage is supplied to an end of a load 1031 of the sense amplifier 103, whereby the sense amplifier 103 is activated. The Y switch 102 and the selection transistor 1012 are turned ON. Meanwhile, the selection transistor 13 of the dummy cell 10 remains in an OFF-state. Thus, the memory cell 101 (resistance change cell 1011) is selectively connected to the input terminal of the sense amplifier 103, and thus electric current (minute current) flows through the resistance change cell 1011. As a result, a potential according to the resistance value of the resistance change cell 1011 appears at the other end of the load 1031. This potential is supplied to one of the inputs of the comparator 106 as the output level SAOUT of the sense amplifier 103.

On the other hand, the same voltage as the positive voltage supplied to the one end of the load 1031 of the sense amplifier 103 is supplied also to one end of a load 1051 of the reference amplifier 105, whereby the reference amplifier 105 is activated. Thus, electric current (minute current) flows also through the reference resistance 104. The reference amplifier 105 supplies a potential appearing at the other end of the load 1051 according to the resistance value of the reference resistance 104 to the other input of the comparator 106 as a reference level RL.

The comparator 106 compares the output level SAOUT from the sense amplifier 103 with the reference level RL from the reference amplifier 105, and outputs the comparison result.

In this manner, the resistance value of the resistance change cell 1011 in the memory cell 101 and the resistance value of the reference resistance 104 are converted into potential levels and compared with each other.

Ideally, the resistance change cell 1011 assumes either one of two different resistance values according to the written data "0" or "1". The resistance value of the reference resistance 104 is set equal to an average (or median value) of the two different resistance values that the resistance change cell 1011 can assume. This enables the resistance change cell 1011 to determine whether the written data is "0" or "1" (to read the data) based on the output of the comparator 106.

Whether the readout data is correct or not depends on characteristics of elements involved in the readout of the data. For example, if the load 1031 of the sense amplifier 103 and the load 1051 of the reference amplifier 105 have mutually different resistance values, the readout data may not be correct. According to this embodiment of the invention, therefore, characteristic check (calibration) is conducted on the elements (readout circuit) involved in the readout of the data.

In order to conduct the calibration, the selection transistor 13 of the dummy cell 10 is turned ON. Meanwhile, the Y switch 102 and the selection transistor 1012 remain in the OFF-state. One of the resistance selecting transistors 12 of the dummy cell 10 is turned ON, whereby one of the selectable resistance values is selected. More specifically, one of the resistance elements 11 or one of the two serially connected resistance elements is selectively connected to the input terminal of the sense amplifier 103.

In this embodiment of the invention, the resistance selecting transistors 12 are sequentially turned ON one at a time, so that the dummy resistances are selected sequentially in the order of dummy resistance DR1 only, dummy resistance DR1+DR2, dummy resistance DR1+DR3, . . . , and dummy resistance DR1+DRn. In this manner, the resistance value of the dummy cell 10 is changed in a stepwise manner. The resistance value selected in each step is compared with the resistance value of the reference resistance 104 in the same manner as in the readout of data described above. Specifically, these resistance values are converted into corresponding potential levels, and these potential levels are compared with each other. Thus, the resistance value of the reference resistance 104 is monitored by the comparator 106.

The resistance values of the dummy cell 10 before and after the change of the output of the comparator 106 can be specified by comparing the resistance values of the dummy cell 10, while stepwise changing the same, with the resistance value of the reference resistance 104. That is, this makes it possible to specify a threshold (range) used for determining whether the data read out from the memory cell 101 is "1" or "0" by means of a combined circuit of the reference resistance 104, the reference amplifier 105, and the comparison and readout circuit 107 (hereafter, simply referred to as the readout circuit). For example, if the output of the comparator 106 indicates "1" when the resistance value of the dummy cell 10 is a[kΩ] and the output of the comparator 106 indicates "0" when the resistance value of the dummy cell 10 is a+x[kΩ], it can be confirmed that the output of the above-mentioned readout circuit indicates "1" when the resistance value of the memory cell 101 is a[kΩ] or lower, and indicates "0" when resistance value of the memory cell 101 is a+x[kΩ] or higher.

The calibration operation may be terminated upon detecting a change in the output of the comparator 106.

The semiconductor device according to the first embodiment of the invention, as described above, is configured by providing the readout circuit with a dummy cell circuit (10) capable of setting a plurality of current values flowing therethrough, the readout circuit being designed to compare a cell voltage according to current flowing through a selected memory cell (101) with a reference voltage according to current flowing through the reference resistance (104), so that the voltage according to current flowing the dummy cell circuit, instead of the voltage according to current flowing through the selected memory cell, can be compared with the reference voltage. This makes it possible to detect current generating a voltage exceeding the reference voltage by varying the current flowing through the dummy cell circuit, and thus to check whether or not the reference circuit system is operating in a desired operation range. Furthermore, the checking result can be reflected in setting the data write conditions and the cell configuration such that the memory cell exhibits a preferable resistance value.

According to this first embodiment of the invention, as described above, the provision of the resistance reference unit (dummy cell 10) in the readout system circuit of the semiconductor device enables reliable checking of the characteristics and reliability of the readout circuit. This makes it possible to discriminate failures attributable to a memory cell from failures attributable to other parts than memory cells. Further, in device evaluation as well, the cell resistance value can be obtained more accurately, whereby the evaluation results can be fed back for effective use in future development of devices and countermeasures against failures.

Although only one memory cell 101 is shown in FIG. 1, it is a common configuration that a single sense amplifier is shared by a plurality of memory cells. An example of such configuration is shown in FIG. 2 and FIG. 3.

Figure 2:
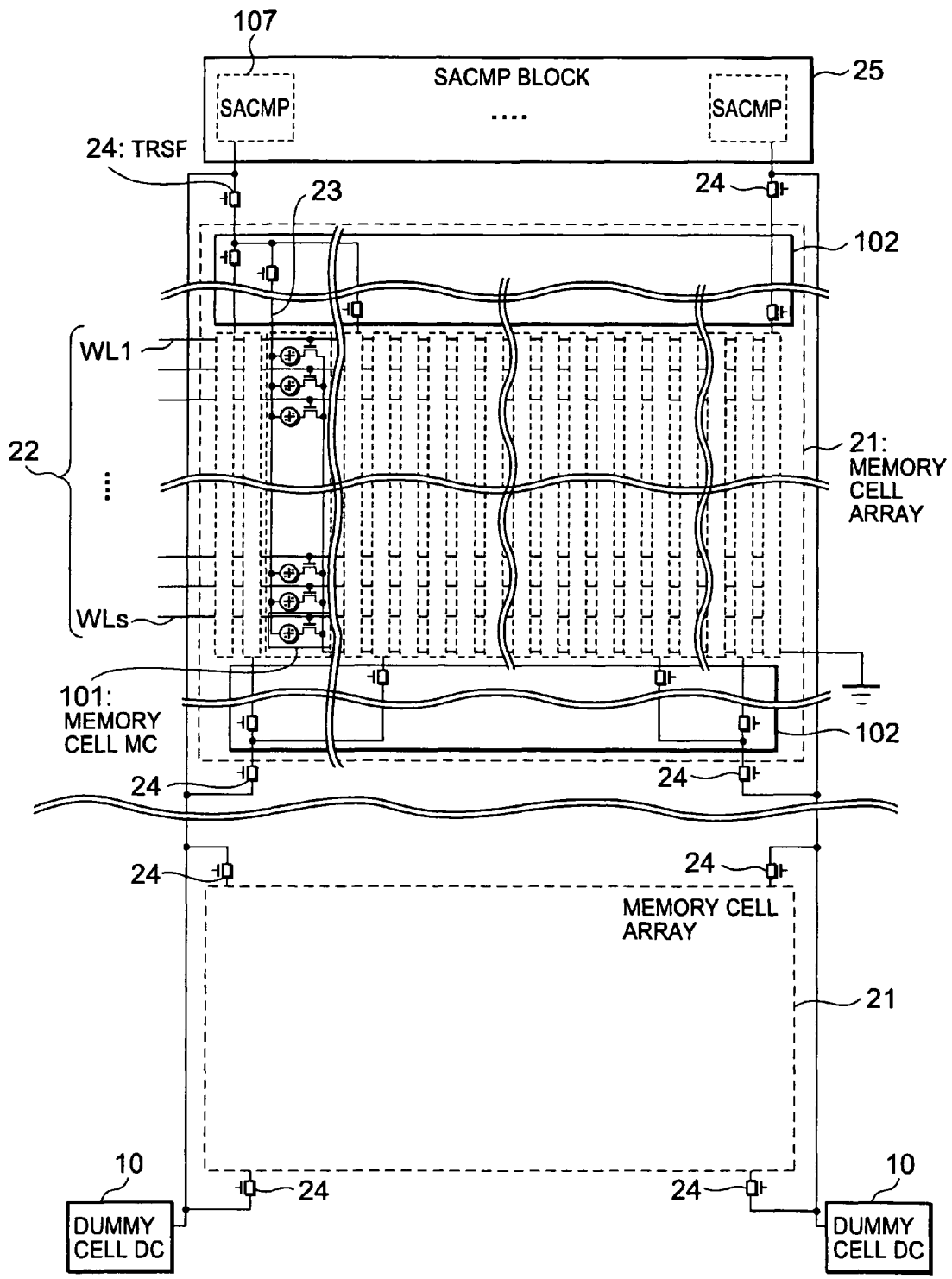
FIG. 2 is a diagram for explaining a configuration of a principal part of the semiconductor device according to the first embodiment of this invention.

In the semiconductor device according to this embodiment of the invention, as shown in FIG. 2, a plurality of memory cells 101 form a memory cell array 21 together with a plurality of Y switches 102. The plurality of memory cells 101 are arranged in lines and columns, the memory cells 101 in each line being commonly connected to a word line (WL1 to WLs) 22, and the memory cells 101 in each column being commonly connected to a bit line 23. The Y switches 102 are connected to the respective bit lines 23. Each of the Y switches 102 is connected to one of transfer switches (MOS transistors TRSF) 24. The plurality of memory cells 101 are thus arranged in a hierarchy with the use of the transfer switches 24 and the Y switches 102. Each of the transfer switches 24 is connected, together with a dummy cell 10, to one of the comparison and readout circuits 107 included in a SACMP block 25. The transfer switches 24 is also controlled by the control signals from the control device 15. Each dummy cell 10 is activated in response to the control signals to change the resistance value thereof. With this structure, one of the memory cells may be selected to connected to any one of the readout circuits 107.

Figure 3:
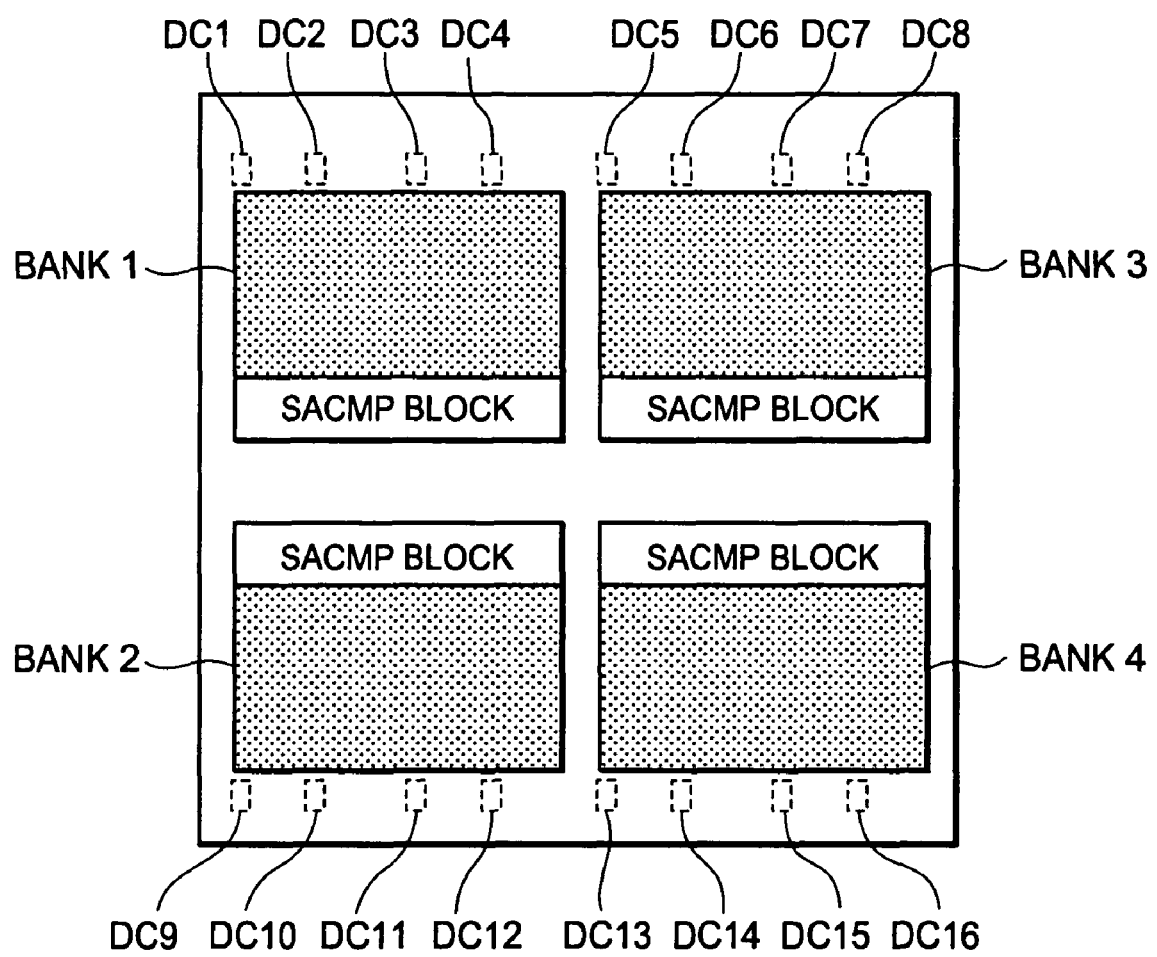
FIG. 3 is a diagram showing an arrangement example of dummy cells in the semiconductor device shown in FIG. 2.

As shown in FIG. 3, for example, four dummy cells 10 are arranged in each bank, and 16 dummy cells 10 are arranged in each chip. Specifically, the dummy cells DC1 to DC4 are assigned to the bank 1, the dummy cells DC5 to DC8 to the bank 2, the dummy cells DC9 to DC12 to the bank 3, and the dummy cells DC13 to DC16 to the bank 4. In the shown embodiment, the dummy cells 10 and the sense amplifiers 103 are associated in one-to-one relationship.

The dummy cells 10 may be referred to as a dummy cell circuit. The sense amplifiers 103 may be referred to as a sense circuit. The reference amplifiers 105 may be referred to as a reference circuit.

Next, a semiconductor device according to a second embodiment of this invention will be described with reference to FIG. 4 and FIG. 5.

Figure 4:
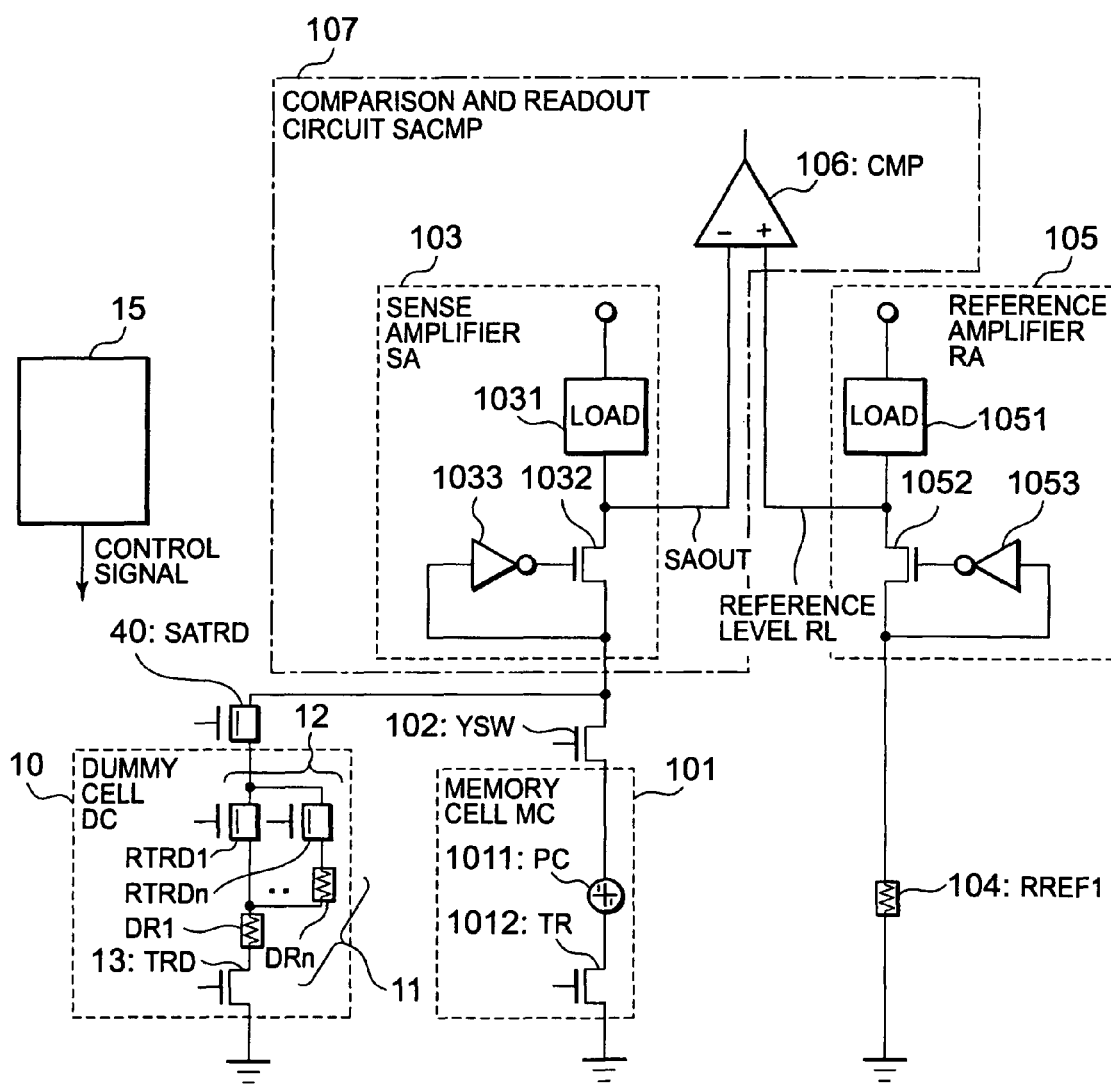
FIG. 4 is a circuit diagram showing a schematic configuration of a readout system circuit in a semiconductor device according to a second embodiment of this invention.
Figure 5:
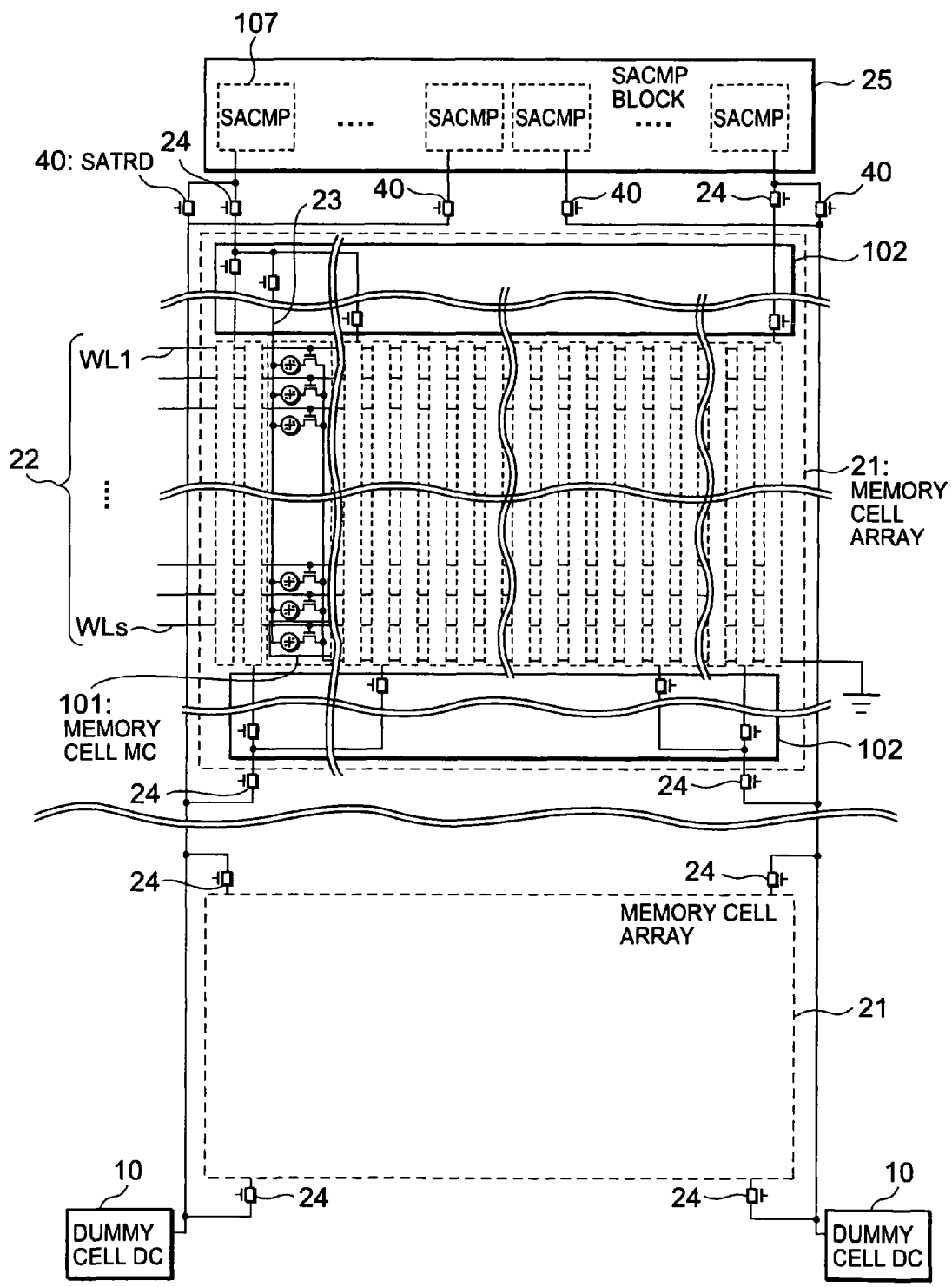
FIG. 5 is a diagram for explaining a configuration of a principal part of the semiconductor device according to the second embodiment of this invention.

As shown in FIG. 4, the semiconductor device according to the second embodiment has a readout system circuit in which, in addition to the configuration of FIG. 1, a sense amplifier selecting transistor (SATRD) 40 is connected between the dummy cell 10 and the comparison and readout circuit 107. As shown in FIG. 5, this sense amplifier selecting transistor 40 is for selectively connecting one dummy cell 10 to a plurality of comparison and readout circuits 107 (sense amplifiers 103). This means that the sense amplifier selecting transistor 40 functions as a comparison unit selecting switch for selecting one of the plurality of comparison and readout circuits 107 connected to the one dummy cell 10.

The sense amplifier selecting transistor 40 is turned OFF (is in the inactive state) during normal operation (in the normal mode). During calibration (in the test mode), only the sense amplifier selecting transistor 40 connected to the sense amplifier 103 to be calibrated is turned ON (activated).

According to this second embodiment, the dummy cells 10 are provided in the same number as that of the sense amplifiers to be activated simultaneously, which enables simultaneous calibration of a plurality of readout circuits, without changing the logic state of the readout signal activating signal for activating the readout circuits.

Although this invention has been described in conjunction with a few preferred embodiments thereof, this invention is not limited to the foregoing embodiments but may be modified in various other manners within the scope of the invention.

For example, although in the dummy cell 10 according to the embodiments described above, the dummy resistances DR2 to DRn are connected in series to the dummy resistance DR1, one of a plurality of resistance elements may simply be selected. Alternatively, a plurality of resistances may be connected in parallel with the use of switches.

Not only the memory cell 101 but also the dummy cell 10 and the reference resistor 104 may comprise a phase change memory cell.

What is claimed is:

1. A semiconductor device comprising:
   a plurality of memory cells;
   a reference resistive element;
   a dummy cell circuit;
   a sense circuit producing, at an output node thereof, in a first mode, a first voltage related to a selected one of the memory cells and, in a second mode, a second voltage related to the dummy cell circuit;
   a reference circuit producing, at an output node thereof, a third voltage related to the reference resistive element; and
   a comparator comparing voltages at the output nodes of the sense circuit and the reference circuit with each other,
   wherein the first mode comprises a normal operation mode in which data stored in the selected one of the memory cells is determined by the comparator comparing the first voltage with the third voltage, and the second mode comprises a test operation mode in which a resistance value of the reference resistive element is monitored by the comparator comparing the second voltage with the third voltage.

2. The device as claimed in claim 1, wherein the dummy cell circuit represents a plurality of resistance values so that the second voltage may be changed in accordance with a selected one of the resistance values.

3. The device as claimed in claim 2, wherein the dummy cell circuit includes a plurality of resistive elements, at least one of the resistive elements are activated to represent the selected one of the resistance values.

4. The device as claimed in claim 1, further comprising:
   a first switch coupled between the selected one of the memory cells and the sense circuit; and
   a second switch coupled between the dummy cell circuit and the sense circuit,
   the first switch being turned ON in the first mode and the second switch being turned ON in the second mode.

5. The device as claimed in claim 4, further comprising:
   a third switch coupled between the selected one of the memory cells and a reference potential point; and
   a fourth switch coupled between the dummy cell circuit and the reference potential point,
   the third switch being turned ON in the first mode and the fourth switch being turned ON in the second mode.

6. The device as claimed in claim 1, wherein each of the plurality of memory cells comprises a phase change memory cell.

7. The device as claimed in claim 1, wherein the dummy cell circuit is supplied with a set of control signals in the second mode to change a resistance value of the dummy cell circuit.

8. The device as claimed in claim 7, wherein the dummy cell circuit comprises a plurality of dummy cells, selected one or ones of the dummy cells are activated in response to the set of control signals to change the resistance value of the dummy cell circuit.

9. The device as claimed in claim 8, each of the memory cells, the dummy cells and the reference resistive elements comprises a phase change memory cell.

10. A semiconductor device comprising:
    a plurality of memory cells;
    a reference resistive element;
    a dummy cell circuit;
    a sense circuit activated in a first mode to produce, at a first output node thereof, a first voltage related to a current flowing through a selected one of the memory cells, the sense circuit being further activated in a second mode to produce, at the first output node, a second voltage related to a current flowing through the dummy cell circuit;
    a reference circuit activated in the first mode to produce, at a second output node thereof, a third voltage related to a current flowing through the reference resistive element, the reference circuit being further activated in the second mode to produce, at the second output node, the third voltage; and
    a comparator coupled to the first output node of the sense circuit and the second output node of the reference circuit to compare the first voltage with the third voltage in the first mode and the second voltage with the third voltage in the second mode.

11. The device as claimed in claim 10, wherein the first mode designates a data read operation mode and the second mode designates a test mode.

12. The device as claimed in claim 10, wherein the sense circuit comprises a first input node and a first transistor coupled between the first input node and the first output node, and the reference circuit comprises a second input node and a second transistor coupled between the second input node and the second output node, the first input node of the sense circuit being coupled to the selected one of the memory cells in the first mode and to the dummy cell circuit in the second mode.

13. The device as claimed in claim 12, wherein the sense circuit further comprises a first inverter circuit coupled between the first input node and a gate of the first transistor, and the reference circuit further comprises a second inverter circuit coupled between the second input node and a gate of the second transistor.

14. The device as claimed in claim 10, wherein the dummy cell circuit is configured to represent a plurality of impedances to vary the current flowing through the dummy cell circuit.

15. The device as claimed in claim 14, wherein the dummy cell circuit is configured to represent a plurality of impedances comprising first, second and third impedances, the first impedance being substantially equal to an impedance of the reference resistive element, the second impedance being higher than the first impedance, and the third impedance being lower than the first impedance.

16. A semiconductor device comprising:

a plurality of memory cell arrays, each of the memory cell arrays including:
- a plurality of word lines;
- a plurality of bit lines;
- a plurality of memory cells each coupled to an associated one of the word lines and an associated one of the bit lines;
- a circuit node; and
- a plurality of first selection transistors each coupled between the circuit node and an associated one of the bit lines;

a sense circuit comprising an input node and an output node, the sense circuit being configured to produce a sense voltage at the output node in response to a current supplied to the input node;

a plurality of second selection transistors each coupled between the input node of the sense circuit and the circuit node of an associated one of the memory cell arrays;

a dummy cell circuit provided commonly to the memory cell arrays and coupled to the input node of the sense circuit;

a reference circuit including a reference resistive element and producing, at an output terminal thereof, a reference voltage in response to a current flowing through the reference resistive element; and a comparator including a first input terminal coupled to the output node of the sense circuit and the output terminal of the reference circuit to compare the sense voltage with the reference voltage.

17. The device as claimed in claim 16, wherein one of the second selection transistors is turned ON in a first mode to designate one of the memory cell arrays, one of the first selection transistors belonging to a designated one of the memory cell arrays being turned ON in the first mode to select one of the memory cells belonging to the designated one of the memory cell arrays, the sense circuit receiving, at the input node, a current flowing through a selected one of the memory cells belonging to the designated one of the memory cell arrays in the first mode, none of the first and second selection transistors being turned ON in a second mode so that the sense circuit receives, at the input node, a current flowing through the dummy cell circuit.

18. The device as claimed in claim 17, wherein the first mode designates a data read operation mode and the second mode designates a test mode.

19. The device as claimed in claim 16, further comprising a third selection transistor coupled between the input node of the sense circuit and the dummy cell circuit.

* * * * *